United States Patent
Meyer, IV et al.

(10) Patent No.: US 9,646,935 B1
(45) Date of Patent: May 9, 2017

(54) HEAT SINK OF A METALLIC SHIELDING STRUCTURE

(71) Applicant: Celsia Technologies Taiwan, Inc., Taoyuan County (TW)

(72) Inventors: George A. Meyer, IV, Morgan Hill, CA (US); Hsin-Hua Wen, Taoyuan County (TW); Ming-Kuei Hsieh, Taoyuan County (TW); Chieh-Ping Chen, Taoyuan County (TW)

(73) Assignee: CELSIA TECHNOLOGIES TAIWAN, INC., Taoyuan (TW)

( * ) Notice: Subject to any disclaimer, the term of this patent is extended or adjusted under 35 U.S.C. 154(b) by 0 days.

(21) Appl. No.: 14/885,194

(22) Filed: Oct. 16, 2015

(51) Int. Cl.
*H01L 23/552* (2006.01)
*H05K 7/20* (2006.01)
*H01L 23/473* (2006.01)
*H01L 23/40* (2006.01)
*H01L 23/367* (2006.01)
*H01L 23/373* (2006.01)
*H05K 1/02* (2006.01)

(52) U.S. Cl.
CPC ........ *H01L 23/552* (2013.01); *H01L 23/3675* (2013.01); *H01L 23/3736* (2013.01); *H01L 23/40* (2013.01); *H01L 23/473* (2013.01); *H05K 1/0204* (2013.01); *H05K 7/2029* (2013.01)

(58) Field of Classification Search
CPC ..... H01L 23/552; H01L 23/473; H01L 23/40; H01L 23/3736; H01L 23/3675; H05K 1/0204; H05K 7/2029

USPC ........................ 361/679.52–679.54, 699–711
See application file for complete search history.

(56) References Cited

U.S. PATENT DOCUMENTS

| | | | | |
|---|---|---|---|---|
| 6,082,443 A | * | 7/2000 | Yamamoto | F28D 15/0233 165/104.21 |
| 2007/0285892 A1 | * | 12/2007 | Mindock | H01L 23/427 361/700 |
| 2008/0210407 A1 | * | 9/2008 | Kim | F28D 15/0233 165/104.26 |
| 2008/0236795 A1 | * | 10/2008 | You | H01L 23/427 165/104.21 |
| 2011/0315351 A1 | * | 12/2011 | Meyer, IV | F28D 15/0233 165/104.26 |
| 2012/0014068 A1 | * | 1/2012 | Nakanishi | H01L 23/10 361/717 |
| 2012/0325437 A1 | * | 12/2012 | Meyer, IV | F28F 21/084 165/104.26 |
| 2012/0325438 A1 | * | 12/2012 | Meyer, IV | F28D 15/046 165/104.26 |
| 2013/0027878 A1 | * | 1/2013 | Campbell | H05K 7/2029 361/694 |
| 2013/0199757 A1 | * | 8/2013 | Meyer, IV | F28D 15/0275 165/104.26 |

(Continued)

*Primary Examiner* — Anthony Haughton
*Assistant Examiner* — Yahya Ahmad
(74) *Attorney, Agent, or Firm* — Chun-Ming Shih; HDLS IPR Services

(57) ABSTRACT

A heat sink of a metallic shielding structure is provided in this disclosure, which includes a heating module and a cooling module. The heating module includes a heat generating component, a substrate, and a shield housing. The heat generating component is electrically connected to one side surface of the substrate and forms an opening corresponding the substrate. The cooling module includes a body and a working fluid is disposed in the body.

9 Claims, 4 Drawing Sheets

(56) References Cited

U.S. PATENT DOCUMENTS

2014/0015106 A1\* 1/2014 Hsieh .................... H01L 23/562
                                                            257/618
2016/0338222 A1\* 11/2016 Reeves .............. H05K 7/20254

\* cited by examiner

HEAT SINK OF A METALLIC SHIELDING STRUCTURE

TECHNICAL FIELD

The present invention relates to a heat sink and, in particular, to a heat sink of a metallic shielding structure, which prevents electromagnetic interference (EMI) and also provides heat dissipation.

BACKGROUND

With the rapid development of electronic technology, electronic products have become light, slim, small-sized and their functions have become diverse. When electronic equipment is working or operated, electronic components generate electromagnetic fields, and the electromagnetic field interferes with the normal operation of the electronic equipment, and the electromagnetic wave radiates out to impair health, which is a so called electromagnetic interference (EMI) phenomenon. The methods to prevent EMI include applying a conductive paint, performing a vacuum sputtering process, or adding a suitable metallic EMI shielding structure, and the latest has a low cost and meets the present requirements of environmental protection, so is most frequently used.

Conventional EMI shielding structure simply has the function of shielding the electromagnetic waves. In fact, the electromagnetic components generate a huge amount of heat during operation or use. The heat accumulated in a housing is unable to dissipate out, and the heat conductivity rate of the metallic EMI shielding structure is too slow, so the heat generated by the electronic components cannot efficiently dissipate out via the housing. Consequently, the heat in the electronic components continues to increase, thereby reducing the lifespan of the electronic components covered by the housing or compromising the product performance.

Accordingly, the aim of this disclosure is to achieve the best EMI shielding and also provides excellent heat dissipation efficiency.

SUMMARY

It is an object of the present invention to provide a heat sink of a metallic shielding structure which prevents electromagnetic interference (EMI) and provides heat dissipation.

Accordingly, the present invention provides a heat sink of a metallic shielding structure, which provides a heating module and a cooling module. The heating module includes a heat generating component, a substrate, and a shield housing. The heat generating component is electrically connected to one side surface of the substrate and forms an opening corresponding the substrate. The cooling module includes a body and a working fluid is disposed in the body. When the heat generating component generates heat to form a warmer temperature area, the working fluid in the body is heated to be vaporized and diffused to at least one distal ends to form a low temperature area. When the vaporized working fluid flows to the low temperature area, the working fluid is condensed into a liquid state and flows back to the warmer temperature area.

It is preferable that the heating module further includes a mother board and a socket connector electrically connected to the mother board, the substrate is disposed on the socket connector, and the shield housing covers the socket connector and is disposed on the mother board.

It is preferable that the heat sink further comprises a capillary structure surroundingly disposed on an inner surface of the body.

It is preferable that the heat sink comprises a support structure supporting the capillary structure and two opposite side plates of the body, and the capillary structure, and the support structure and the capillary structure are sequentially disposed between the two opposite side plates of the body.

It is preferable that the support structure has two lateral plates and a plurality of wave-shaped plates connected to the lateral plates. Each of the wave-shaped plates consists of a plurality of wave-peak sections and a plurality of wave-trough sections, any two adjacent wave-peak sections are disposed in staggered relation to each other, and any two wave-trough sections are disposed in staggered relation to each other.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Figure 1:
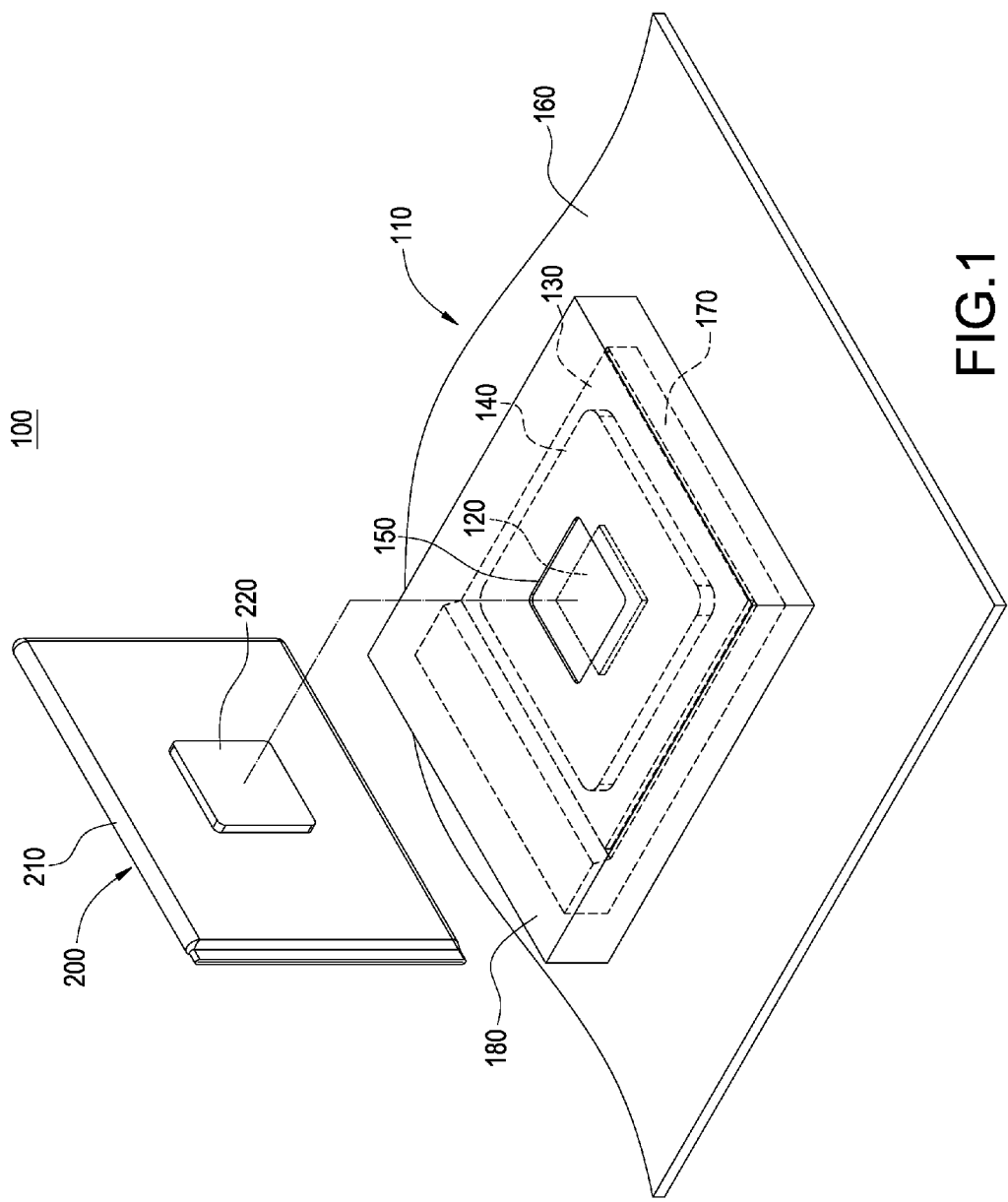
FIG. 1 is a perspective view of the present invention, illustrating a heat sink of a metallic shielding structure.
Figure 2:
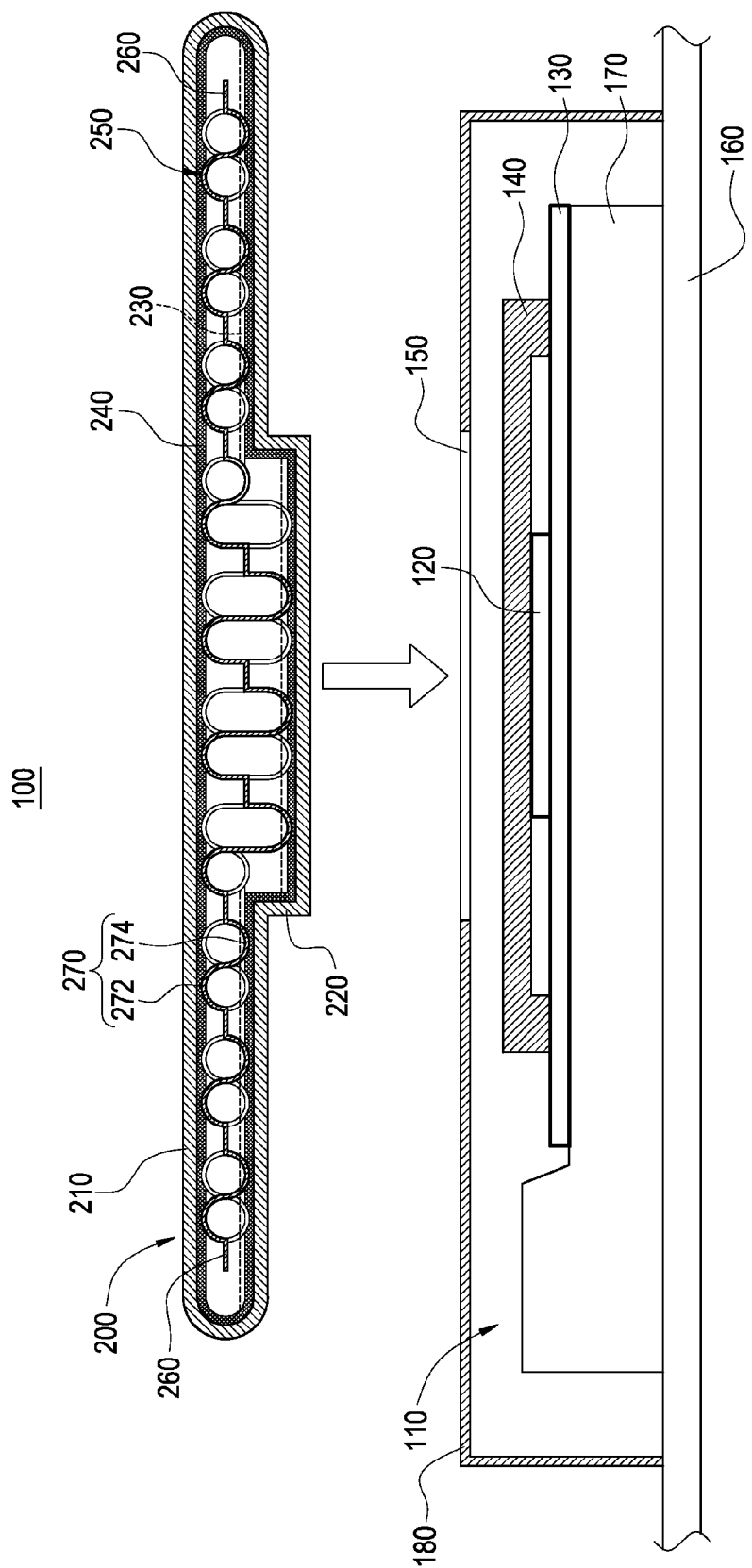
FIG. 2 is a cross-sectional view of the present invention, illustrating the heat sink of the metallic shielding structure.
Figure 3:
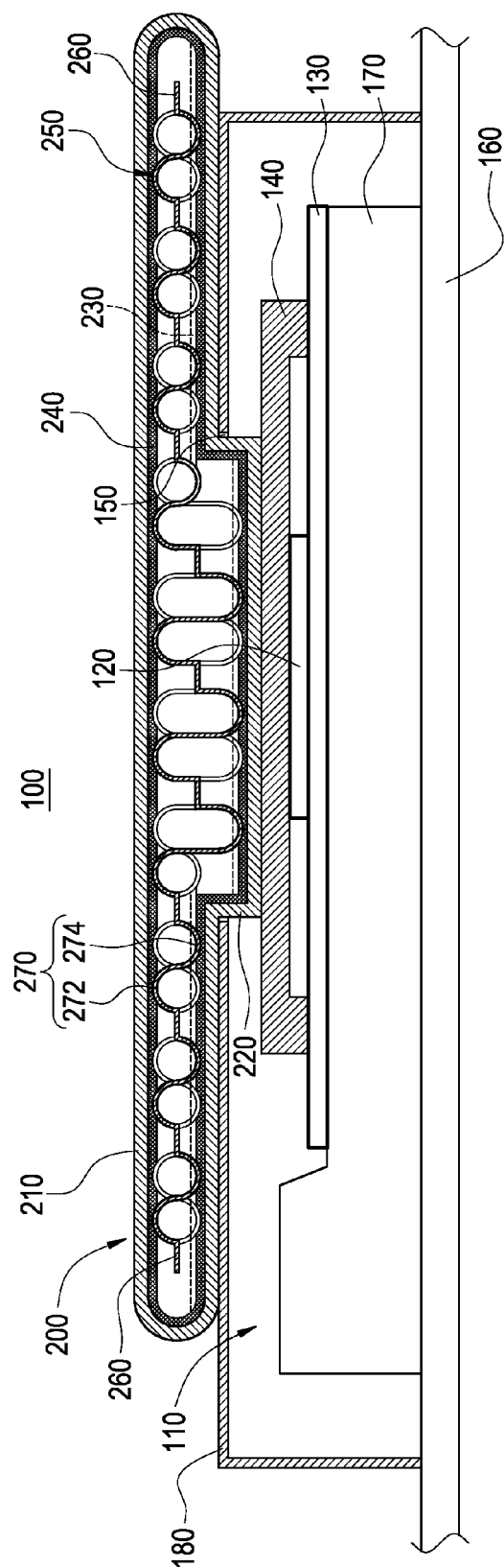
FIG. 3 is a cross-sectional view of the present invention, illustrating the assembled heat sink of the metallic shielding structure.

Referring to FIGS. 1 to 3, the present invention provides a heat sink 100 of a metallic shielding structure, which includes a heating module 110 and a cooling module 200. The heating module 110 includes a heater 120, a substrate 130, a metallic housing 140, and a shield housing 180. In the figures, the heater 120 includes but is not limited to a central processing unit (CPU) or other suitable chip sets. The heater 120 is electrically connected to one side surface of the substrate 130. The metallic housing 140 is disposed on the substrate 130 and is attached to the heater 120. The shield housing 180 covers the metallic housing 140 and forms an opening 150 corresponding thereto.

In the present embodiment, the heating module 110 further includes a mother board 160 and a socket connector 170 electrically connected to the mother board 160. The substrate 130 is disposed on the socket connector 170, and the shield housing 180 covers the socket connector 170 and is disposed on the mother board 160. In detail, the substrate 130 is preferably a flip chip substrate. One side surface of the substrate 130 includes a plurality of contact members (not illustrated) in a needle shape, and each of the contact members is directly inserted into the socket connector 170 for making connection. Therefore, a high-density integrated circuit design can be achieved to reduce the size of the heater 120, lower a production cost, and obtain a good electrical property and good heat-dissipation effect. However, in a different embodiment, the substrate 130 can also be an ordinary mother board, a circuit board, or etc. onto which the heater 120 is directly welded.

In response to the increasing demand for avoidance of high frequency interference and miniaturization in a tablet PC, a microprocessor for a high-class notebook, and an electronic chip for a desktop computer, electromagnetic interference (EMI) shielding is carried out by utilizing the shield housing 180 or applying coatings (e.g. applying coatings using a conductive paint or applying sprayed coatings using a zinc wire) thereon. In the present embodiment, EMI is still emitted through the opening of the shield housing 180 or other holes. Therefore, by putting the cooling module 200 in contact with the heating module 110, the protruding portion 220 completely seal the opening 150 of the shield housing 180, thereby reducing EMI. The shield housing 180 can be formed of a metallic can, a thin metal plate, metal foil, a conductive web, or a metal tape, or can even use the foregoing conductive paint, and other suitable materials.

Referring to FIGS. 2 and 3, the cooling module 200 includes a body 210 and a protruding portion 220 disposed on one side surface of the body 210. The protruding portion 220 is disposed corresponding to the opening 150, a working fluid 230 is disposed in the body 210, and the protruding portion 220 protrudes into the opening 150 to contact a surface of the metallic housing 140. As shown in the figures, a width of the protruding portion 220 matches a size of the opening 150, so that the protruding portion 220 can pass through the opening 150 to contact against the surface of the metallic housing 140.

When the heater 120 generates heat to form a warmer temperature area H, the working fluid 230 in the protruding portion 220 is heated to be vaporized and diffused to two distal ends of the body 210 to form a low temperature area L. When the working fluid 230 is transformed from a liquid state to a vapor state, the working fluid 230 takes away a huge amount of heat. When the vaporized working fluid 230 flows to the low temperature area L, the working fluid 230 is condensed into the liquid state and flows back to the warmer temperature area H, thereby completing a heat transfer cycle.

In the present embodiment, the heat sink 100 further comprises a capillary structure 240 circularly disposed on an inner surface of the body 210. When the working fluid 230 is water, alcohol, or a combination thereof, the capillary structure 240 can quickly direct the working fluid 230, vaporized by heat, to the two distal ends (i.e. the low temperature area) of the body 210, thereby accelerating heat dissipation. The capillary structure 240 includes but is not limited to a woven metal net.

Furthermore, in the embodiment shown in FIGS. 2 and 3, the heat sink 100 further includes a support structure 250 supporting the capillary structure 240 and two opposite side plates of the body 210. As shown in the figures, the capillary structure 240, and the support structure 250 and the capillary structure 240 are sequentially disposed between the two opposite side plates of the body 210. The support structure 250 includes two lateral plates 260 and a plurality of wave-shaped plates 270 connected to the lateral plates 260. Each of the wave-shaped plates 270 consists of a plurality of wave-peak sections 272 and a plurality of wave-trough sections 274, any two adjacent wave-peak sections 272 are disposed in staggered relation to each other, and any two wave-trough sections 274 are disposed in staggered relation to each other. Particularly, each of the wave-shaped plates 270 has a larger size in the protruding portion 220 than at two sides of the protruding portion 220 so as to support the two opposite side plates of the body 210 and the capillary structure 240 at the inner surface of the two opposite side plates (not labelled).

It should be noted that the support structure 250 is preferably a plate which includes, for example, wave-shaped plates 270 made by pressing to form connected bends, and a plurality of passages (not illustrated) are formed between the body 210 and the capillary structure 240. Finally, the body 210 is sealed and connected by welding, and after injecting the required working fluid 230 into the body 210, a vacuum is created inside the body 210 by suction so as to form a vapor chamber.

Furthermore, the support structure 250 not only can support the capillary structure 240 but also can maintain a distance between the two opposite side plates of the body 210, so that the creation of vacuum or a larger side surface of the body do not cause deformation of the body 210, and a size of the body 210 can be maintained. When the body 210 is the aforesaid vapor chamber, the protruding portion 220 in the warmer temperature area is in contact against the metallic housing 140 to conduct away the heat generated by the heater 120. The working fluid 230 in the capillary structure 240 of the protruding portion 220 is vaporized by the heat, and is quickly directed to the capillary structure 240 at two ends of the body 210 via each of the passages (not illustrated) so as to transfer the heat to the low temperature area. When the working fluid 230 (water vapor herein) contacts the inner surface of the body 210 at a lower temperature, the water vapor is condensed into the liquid state to release heat, so as to complete a heat transfer cycle.

Figure 4:
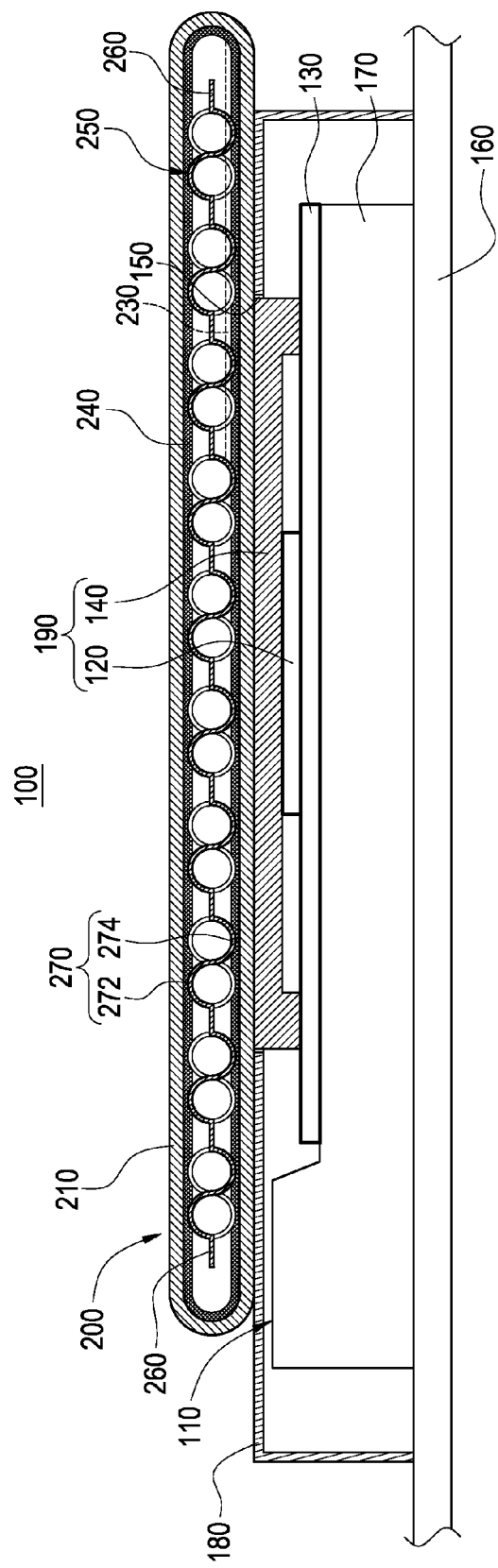
FIG. 4 is another cross-sectional view of the present invention, illustrating the assembled heat sink of the metallic shielding structure.

FIG. 4 shows another preferable embodiment of the present invention. In this embodiment, the body 210 does not have the protruding portion 220, the metallic housing 140 is protrudingly disposed in the opening 150 to contact one side surface of body 210. In other words, an upper surface of the metallic housing 140 is flush with an upper surface of the shield housing 180 in a manner such that the body 210 is in contact with the upper surface of the metallic housing 140 and the upper surface of the shield housing 180. In detail, as shown in FIG. 4, the heating module 110 includes a heat generating component 190, a substrate 130, and a shield housing 180. The heat generating component 190 is electrically connected to one side surface of the substrate 130 and forms an opening 150 corresponding to the substrate 130. The cooling module 200 includes a body 210, and a working fluid 230 is disposed in the body 210.

In the present embodiment, the heat generating component 190 further includes a heater 120 and a metallic housing 140. The heater 120 is electrically connected to the substrate 130, an inner surface of the metallic housing 140 is attached to a surface of the heater 120 and the upper surface of the metallic housing 140 is disposed in the opening 150 and is flush with the shield housing 180. Thus, the heating module 110 is attached to both surfaces of the metallic housing 140 and the shield housing 18, and then the opening 150 is sealed by soldering or other suitable methods. The other components in the present embodiment and their structures are described in the above-mentioned embodiment, so the description thereof is omitted herein.

By utilizing the shield housing 180 to shield the metallic housing 140 and the heater 120 attached thereto, the heat sink 100 of the present invention achieves EMI shielding. Furthermore, by utilizing the protruding portion 220 of the cooling module 200 in contact against the heater 120 of the metallic housing 180, the heat sink 100 of the present invention can quickly and efficiently dissipate the heat generated by the heater 120.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:

1. A heat sink of a metallic shielding structure, comprising:
    a heating module, the heating module including a heat generating component, a substrate, and a shield housing, the heat generating component being electrically connected to one side surface of the substrate;
    a cooling module, the cooling module including a body and a working fluid being disposed in the body, wherein when the heat generating component generates heat to form a warmer temperature area, the working fluid in the body is heated to be vaporized and diffused to at least one distal end to form a low temperature area; when the vaporized working fluid flows to the low temperature area, the working fluid is condensed into a liquid state and flows back to the warmer temperature area,
    wherein the heat generating component further includes a heater and a metallic housing, the heater is electrically connected to the substrate, one side surface of the metallic housing is attached to the heater; and the shield housing forms an opening corresponding to the metallic housing, and
    wherein the cooling module further has a protruding portion disposed on one side surface of the body, the protruding portion is disposed corresponding to the opening and is inserted into the opening to contact the metallic housing.

2. The heat sink of claim 1, wherein the cooling module is attached to both surfaces of the metallic housing and the shield housing to seal the opening by a soldering method.

3. The heat sink of claim 1, wherein the heater is a central processing unit, and the substrate is a circuit board.

4. The heat sink of claim 1, wherein a width of the protruding portion matches a size of the opening.

5. The heat sink of claim 1, wherein the heating module further includes a mother board and a socket connector electrically connected to the mother board, the substrate is disposed on the socket connector, and the shield housing covers the socket connector and is disposed on the mother board.

6. The heat sink of claim 1, further comprising a capillary structure surroundingly disposed on an inner surface of the body.

7. The heat sink of claim 6, wherein the capillary structure is a woven metal mesh.

8. The heat sink of claim 6, further comprising a support structure supporting the capillary structure and two opposite side plates of the body, and the capillary structure, and the support structure and the capillary structure are sequentially disposed between the two opposite side plates of the body.

9. The heat sink of claim 8, wherein the support structure includes two lateral plates and a plurality of wave-shaped plates connected to the lateral plates, each of the wave-shaped plates consists of a plurality of wave-peak sections and a plurality of wave-trough sections, any two adjacent wave-peak sections are disposed in staggered relation to each other, and any two wave-trough sections are disposed in staggered relation to each other.

* * * * *